US008017874B2

(12) United States Patent
Honjo et al.

(10) Patent No.: US 8,017,874 B2
(45) Date of Patent: Sep. 13, 2011

(54) MULTI-LAYERED PRINTED CIRCUIT BOARD WITH A CONDUCTIVE SUBSTRATE AND THREE INSULATING LAYERS WITH WIRING AND GROUND TRACES

(75) Inventors: Mitsuru Honjo, Ibaraki (JP); Katsutoshi Kamei, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 367 days.

(21) Appl. No.: 12/388,953

(22) Filed: Feb. 19, 2009

(65) Prior Publication Data

US 2009/0218126 A1 Sep. 3, 2009

Related U.S. Application Data

(60) Provisional application No. 61/037,006, filed on Mar. 17, 2008.

(30) Foreign Application Priority Data

Feb. 29, 2008 (JP) ................................ 2008-048907

(51) Int. Cl.
H05K 1/00 (2006.01)
(52) U.S. Cl. ..................................... 174/255
(58) Field of Classification Search .......... 174/250–261; 361/749
See application file for complete search history.

(56) References Cited

U.S. PATENT DOCUMENTS

| | | | |
|---|---|---|---|
| 5,634,208 A | 5/1997 | Nishikawa et al. | |
| 5,995,328 A | 11/1999 | Balakrishnan | |
| 6,493,190 B1 | 12/2002 | Coon | |
| 6,963,471 B2 | 11/2005 | Arai et al. | |
| 7,019,959 B2 | 3/2006 | Chua | |
| 7,652,890 B2* | 1/2010 | Ohsawa et al. | 361/749 |
| 2004/0070884 A1 | 4/2004 | Someya et al. | |
| 2005/0115066 A1* | 6/2005 | Honjo et al. | 29/847 |
| 2006/0092572 A1 | 5/2006 | Kiyono | |
| 2007/0133128 A1 | 6/2007 | Arai | |
| 2008/0000679 A1* | 1/2008 | Kamei et al. | 174/262 |
| 2009/0020324 A1* | 1/2009 | Kamei et al. | 174/257 |
| 2009/0151994 A1* | 6/2009 | Ohsawa et al. | 174/261 |
| 2009/0242259 A1* | 10/2009 | Ho et al. | 174/261 |
| 2009/0250252 A1* | 10/2009 | Ho et al. | 174/255 |

FOREIGN PATENT DOCUMENTS

JP 2004-133988 A 4/2004

OTHER PUBLICATIONS

Office Action Issued Nov. 30, 2009 in U.S. Appl. No. 12/369,029.
Office Action Issued Apr. 23, 2010 in U.S. Appl. No. 12/369,029.
Office Action Issued Sep. 9, 2010 in U.S. Appl. No. 12/369,029.
Office Action Issued Jan. 11, 2011 in U.S. Appl. No. 12/369,029.

* cited by examiner

*Primary Examiner* — Chandrika Prasad
(74) *Attorney, Agent, or Firm* — Panitch Schwarze Belisario & Nadel LLP

(57) ABSTRACT

A first insulating layer is formed on a suspension body, and a write wiring trace is formed on the first insulating layer. A second insulating layer is formed on the first insulating layer so as to cover the wiring trace. A write wiring trace is formed, above the write wiring trace, on the second insulating layer. A ground trace is formed on one side of the write wiring trace at a distance on the second insulating layer. A third insulating layer is formed on the second insulating layer so as to cover the wiring trace and the ground trace. An opening is formed in a region, below the write wiring trace, of the suspension body.

7 Claims, 6 Drawing Sheets

F I G. 2
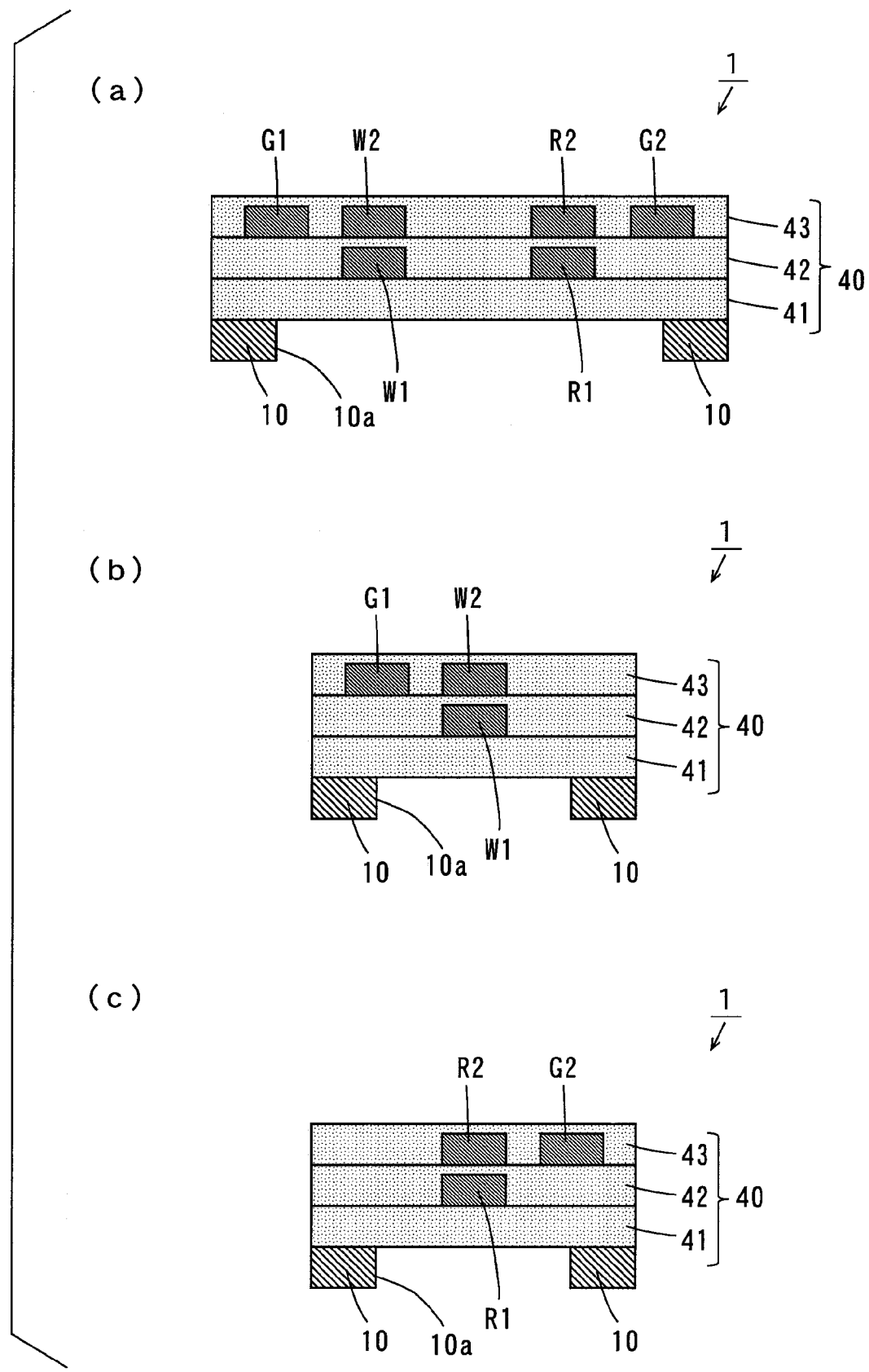

MULTI-LAYERED PRINTED CIRCUIT BOARD WITH A CONDUCTIVE SUBSTRATE AND THREE INSULATING LAYERS WITH WIRING AND GROUND TRACES

BACKGROUND OF THE INVENTION

1. Field of the Invention

The present invention relates to a printed circuit board.

2. Description of the Background Art

An actuator is used in a drive such as a hard disk drive. Such an actuator includes an arm arranged rotatably with respect to a rotation shaft and a suspension board used for a magnetic head that is attached to the arm. The suspension board is a printed circuit board for aligning the magnetic head with a desired track of a magnetic disk.

FIG. 6 is a vertical sectional view showing one example of a conventional suspension board. In the suspension board 900 of FIG. 6, an insulating layer 903 is formed on a metal substrate 902. A pair of write conductors W1, W2 and a pair of read conductors R1, R2 are formed so as to align in sequence on the insulating layer 903.

One ends of the conductors W1, W2, R1, R2 are connected to a magnetic head (not shown). The other ends of the conductors W1, W2, R1, R2 are electrically connected to a write electrical circuit (not shown) and a read electrical circuit (not shown), respectively.

When a write current flows through the write conductors W1, W2, induced electromotive forces are generated in the read conductors R1, R2 by electromagnetic induction in the suspension board 900.

Here, the distance between the write conductors W1, W2 and the read conductor R1 is smaller than the distance between the write conductors W1, W2 and the read conductor R2. This causes a difference in the induced electromotive forces generated in the read conductors R1, R2. As a result, a current flows through the read conductors R1, R2. That is, a crosstalk occurs between the write conductors W1, W2 and the read conductors R1, R2.

Therefore, JP 2004-133988 A proposes a printed circuit board shown in FIG. 7 for preventing occurrence of the crosstalk between the write conductors W1, W2 and the read conductors R1, R2.

FIG. 7 is a vertical sectional view showing another example of the conventional suspension board. In the suspension board 910, a first insulating layer 904 is formed on the metal substrate 902. The write conductor W2 and the read conductor R2 are formed so as to be spaced apart from each other by a distance L1 on the first insulating layer 904.

A second insulating layer 905 is formed on the first insulating layer 904 so as to cover the write conductor W2 and the read conductor R2. On the second insulating layer 905, the write conductor W1 is formed at a position above the read conductor R2, and the read conductor R1 is formed at a position above the write conductor W2.

The distance between the read conductor R1 and the write conductor W2 that are positioned one above the other and the distance between the read conductor R2 and the write conductor W1 that are positioned one above the other are L2, respectively.

In the suspension board 910 of FIG. 7 having the foregoing configuration, the distances between the write conductors W1, W2 and the read conductor R1 are substantially equal to the distances between the write conductors W1, W2 and the read conductor R2, respectively. Accordingly, it is considered that the magnitudes of the induced electromotive forces generated in the read conductors R1, R2 are substantially equal when the write current flows through the write conductors W1, W2.

In the suspension boards 900, 910 shown in FIGS. 6 and 7, impedances of the conductors W1, W2, R1, R2 vary depending on the magnitudes of coupling capacitances between the conductors W1, W2, R1, R2 and the metal substrate 902.

Here, the distance between the write conductor W1 and the metal substrate 902 is different from the distance between the write conductor W2 and the metal substrate 902 in the suspension board 910 of FIG. 7. Moreover, the distance between the read conductor R1 and the metal substrate 902 is different from the distance between the read conductor R2 and the metal substrate 902.

In this case, the coupling capacitance between the write conductor W1 and the metal substrate 902 is different from the coupling capacitance between the write conductor W2 and the metal substrate 902. Moreover, the coupling capacitance between the read conductor R1 and the metal substrate 902 is different from the coupling capacitance between the read conductor R2 and the metal substrate 902.

Therefore, a difference occurs in the impedances of the write conductor W1 and the write conductor W2, and a difference occurs in the impedances of the read conductor R1 and the read conductor R2 in the configuration of the suspension board 910. This may cause a transmission error of a differential signal through the write conductors W1, W2 and cause a transmission error of a differential signal through the read conductors R1, R2.

SUMMARY OF THE INVENTION

An object of the present invention is to provide a printed circuit board in which a signal transmission error can be sufficiently prevented.

(1) According to one aspect of the present invention, a printed circuit board includes a conductive substrate, a first insulating layer formed on the conductive substrate, a first wiring trace formed on the first insulating layer, a second insulating layer formed on the first insulating layer so as to cover the first wiring trace, a second wiring trace formed on the second insulating layer, a first ground trace formed on one side of the second wiring trace at a distance on the second insulating layer, and a third insulating layer formed on the second insulating layer so as to cover the second wiring trace and the first ground trace, wherein the first and second wiring traces constitute a first signal line pair, and an opening is formed in a region, below the first and second wiring traces, of the conductive substrate.

In the printed circuit board, the first insulating layer is formed on the conductive substrate, and the first wiring trace is formed on the first insulating layer. Moreover, the second insulating layer is formed on the first insulating layer so as to cover the first wiring trace, and the second wiring trace is formed on the second insulating layer. In addition, the first ground trace is formed on the one side of the second wiring trace at the distance on the second insulating layer. Then, the third insulating layer is formed on the second insulating layer so as to cover the second wiring trace and the first ground trace. The opening is formed in the region, below the first wiring trace, of the conductive substrate. In such a configuration, the first and second wiring traces constitute the first signal line pair.

Here, the distance between the conductive substrate and the first wiring trace is smaller than the distance between the conductive substrate and the second wiring trace, so that a capacitance of the first wiring trace with respect to the conductive substrate is larger than a capacitance of the second wiring trace with respect to the conductive substrate in the printed circuit board.

Meanwhile, the distance between the first ground trace and the first wiring trace is larger than the distance between the first ground trace and the second wiring trace, so that a capacitance of the first wiring trace with respect to the first ground trace is smaller than a capacitance of the second wiring trace with respect to the first ground trace.

In this case, a difference of the capacitance caused between the first wiring trace and the second wiring trace with respect to the conductive substrate can be canceled by a difference of the capacitance caused between the first wiring trace and the second wiring trace with respect to the first ground trace. This allows an impedance of the first wiring trace and an impedance of the second wiring trace to be equivalent values.

Moreover, the opening is formed in the region, below the first and second wiring traces, of the conductive substrate in the printed circuit board.

In this case, the distance between the first wiring trace and the conductive substrate can be prevented from being much smaller than the distance between the second wiring trace and the conductive substrate. This prevents the capacitance of the first wiring trace with respect to the conductive substrate from being much larger than the capacitance of the second wiring trace with respect to the conductive substrate. As a result, the impedance of the first wiring trace and the impedance of the second wiring trace can easily be the equivalent values because of the foregoing effects of the first ground trace.

These results sufficiently prevent a signal transmission error caused by imbalance of the first signal line pair.

(2) The first wiring trace and the second wiring trace may be arranged so as to be opposite to each other with the second insulating layer sandwiched therebetween.

In this case, the capacitance of the first wiring trace with respect to the conductive substrate and the capacitance of the second wiring trace with respect to the conductive substrate can easily be the equivalent values. Thus, the impedance of the first wiring trace and the impedance of the second wiring trace can easily be the equivalent values.

(3) A width of the first wiring trace and a width of the second wiring trace may be substantially equal.

In this case, the capacitance of the first wiring trace with respect to the conductive substrate and the capacitance of the second wiring trace with respect to the conductive substrate can easily be the equivalent values. Thus, the impedance of the first wiring trace and the impedance of the second wiring trace can easily be the equivalent values.

(4) The printed circuit board may further include a second ground trace formed on the other side of the second wiring trace at a distance on the second insulating layer.

In this case, the difference of the capacitance caused between the first wiring trace and the second wiring trace with respect to the conductive substrate can be canceled using not only the difference of the capacitance caused between the first wiring trace and the second wiring trace with respect to the first ground trace, but also a difference of the capacitance caused between the first wiring trace and the second wiring trace with respect to the second ground trace. Thus, the impedance of the first wiring trace and the impedance of the second wiring trace can further easily be the equivalent values.

In addition, since the ground traces are formed on both sides of the second wiring trace, occurrence of a crosstalk between the first signal line pair and another signal line pair can be prevented.

(5) The printed circuit board may further include a third wiring trace formed on the first insulating layer at a distance from the first wiring trace, and a fourth wiring trace formed on the second insulating layer at a distance from the second wiring trace, wherein the third and fourth wiring traces may constitute a second signal line pair.

In this case, signals indicating different kinds of information can be transmitted using the first signal line pair and the second signal line pair.

(6) The printed circuit board may further include a third ground trace formed on one side of the fourth wiring trace on the second insulating layer.

In this case, a difference of capacitance caused between the third wiring trace and the fourth wiring trace with respect to the conductive substrate can be canceled by a difference of the capacitance caused between the third wiring trace and the fourth wiring trace with respect to the third ground trace. Thus, an impedance of the third wiring trace and an impedance of the fourth wiring trace can be equivalent values. This sufficiently prevents a signal transmission error caused by imbalance of the second signal line pair.

(7) The printed circuit board may further include a head that is provided in the conductive substrate and reads and writes signals, wherein the first, second, third and fourth wiring traces are electrically connected to the head.

In this case, the printed circuit board can be used as a suspension board of a drive such as a hard disk drive.

Then, information can be written and read in/from a magnetic disk by the first and second wiring traces constituting the first signal line pair and the third and fourth wiring traces constituting the second signal line pair.

In this case, since the signal transmission error caused by the imbalance of the first signal line pair and the signal transmission error caused by the imbalance of the second signal line pair are sufficiently prevented, occurrence of an error at the time of writing and reading is reliably prevented.

According to the present invention, the signal transmission error can be prevented.

Other features, elements, characteristics, and advantages of the present invention will become more apparent from the following description of preferred embodiments of the present invention with reference to the attached drawings.

BRIEF DESCRIPTION OF THE DRAWINGS

FIG. 2 is a vertical sectional view of the suspension board taken along the line A-A of FIG. 1.

DESCRIPTION OF THE PREFERRED EMBODIMENTS

Figure 1:
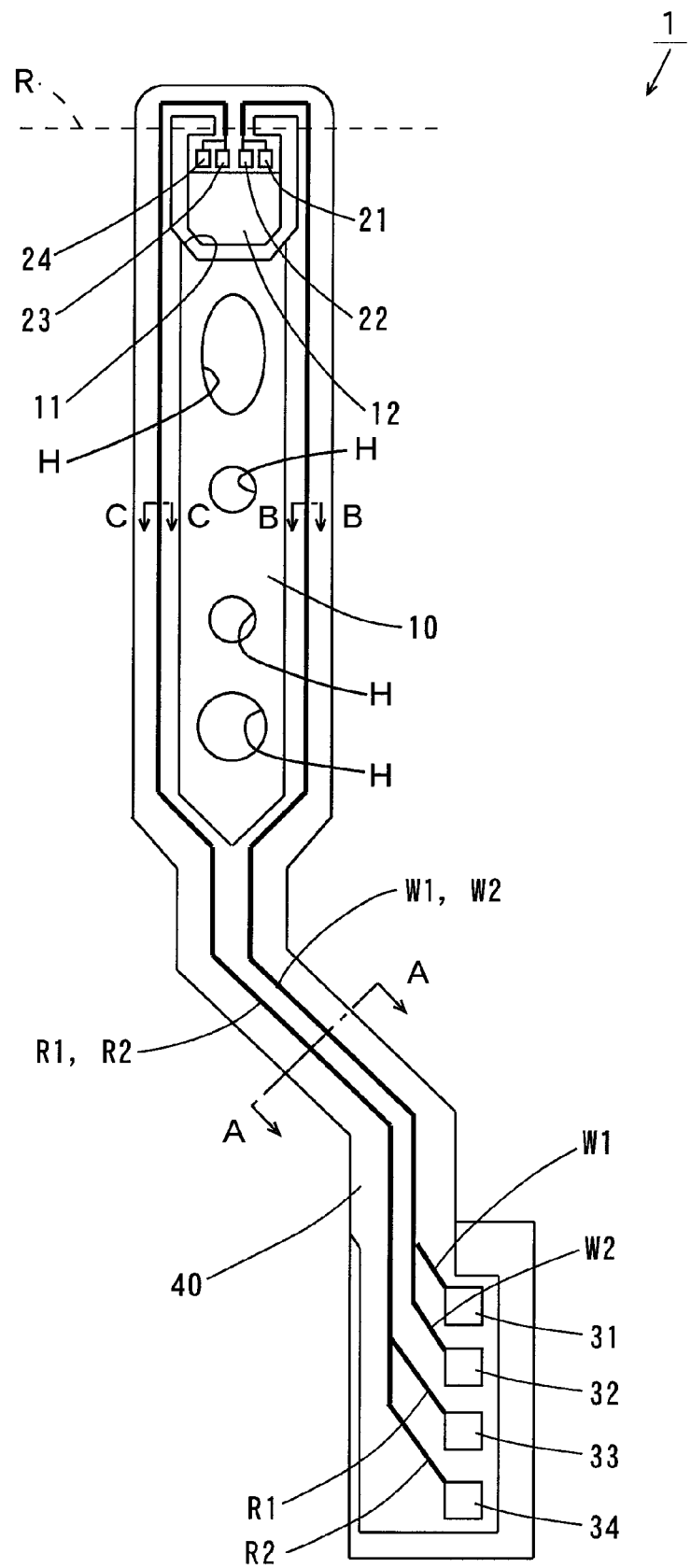
FIG. 1 is a plan view of a suspension board according to a first embodiment of the present invention.

Hereinafter, a printed circuit board and a method of manufacturing the same according to embodiments of the present invention will be described while referring to the drawings. The configuration of a suspension board used in an actuator of a hard disk drive and a method of manufacturing the same will be described as an example of the printed circuit board according to the embodiments of the present invention.

First Embodiment (1-1) Configuration of the Suspension Board

FIG. 1 is a top view of the suspension board according to a first embodiment of the present invention, and FIG. 2 is a vertical sectional view of the suspension board 1 of FIG. 1. Note that in FIG. 2, (a) shows a sectional view taken along the arrowed line A-A of FIG. 1, (b) shows a sectional view taken along the arrowed line B-B, and (c) shows a sectional view taken along the arrowed line C-C.

As shown in FIG. 1, the suspension board 1 includes a suspension body 10 formed of a long-sized metal substrate. Write wiring traces W1, W2 and read wiring traces R1, R2 are formed on the suspension body 10 as indicated by the thick solid lines.

At an end of the suspension body 10, a U-shaped opening 11 is formed, thereby providing a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected to one another by the wiring traces W1, W2, R1, R2, respectively. A plurality of holes H are formed in the suspension body 10.

In the suspension board 1, an insulating layer 40 composed of a plurality of layers is formed in a region where the plurality of wiring traces W1, W2, R1, R2 are formed so as to cover each of the wiring traces W1, W2, R1, R2.

As shown in FIG. 2, a long-sized opening 10a is formed in a region, below the wiring traces W1, W2, R1, R2, of the suspension body 10. The insulating layer 40 is composed of first, second and third insulating layers 41, 42, 43. The first insulating layer 41 is formed on the suspension body 10.

The write wiring trace W1 for writing information in a magnetic disk that is not shown and the read wiring trace R1 for reading information from the magnetic disk are formed on the first insulating layer 41. The write wiring trace W1 and the read wiring trace R1 are aligned in parallel with each other at a predetermined distance. Note that the wiring traces W1, R1 are provided in a region above the opening 10a.

The second insulating layer 42 is formed on the first insulating layer 41 so as to cover the write wiring trace W1 and the read wiring trace R1.

On the second insulating layer 42, the write wiring trace W2 is formed at a position above the write wiring trace W1, and the read wiring trace R2 is formed at a position above the read wiring trace R1.

In addition, on the second insulating layer 42, a ground trace G1 is formed on one side of the write wiring trace W2 and a ground trace G2 is formed on one side of the read wiring trace R2. The write wiring trace W2 and the ground trace G1 align in parallel with each other at a predetermined distance. The read wiring trace R2 and the ground trace G2 align in parallel with each other at a predetermined distance.

The third insulating layer 43 is formed on the second insulating layer 42 so as to cover the wiring traces W2, R2 and the ground traces G1, G2.

In the hard disk that is not shown including the suspension board 1, a current flows through the pair of write wiring traces W1, W2 at the time of writing information in the magnetic disk. Moreover, the current flows through the pair of read wiring traces R1, R2 at the time of reading information from the magnetic disk.

(1-2) Manufacture of the Suspension Board

The method of manufacturing the suspension board 1 will be described. Description of respective steps of forming the tongue 12, the electrode pads 21 to 24, 31 to 34 and the holes H of FIG. 1 is omitted in the following. While the region shown in the sectional view taken along the arrowed line A-A of FIG. 1 is explained as an example in the following for simplicity, the regions shown in the sectional view taken along the arrowed line B-B and the sectional view taken along the arrowed line C-C of FIG. 1 are formed by the same processes.

Figure 3:
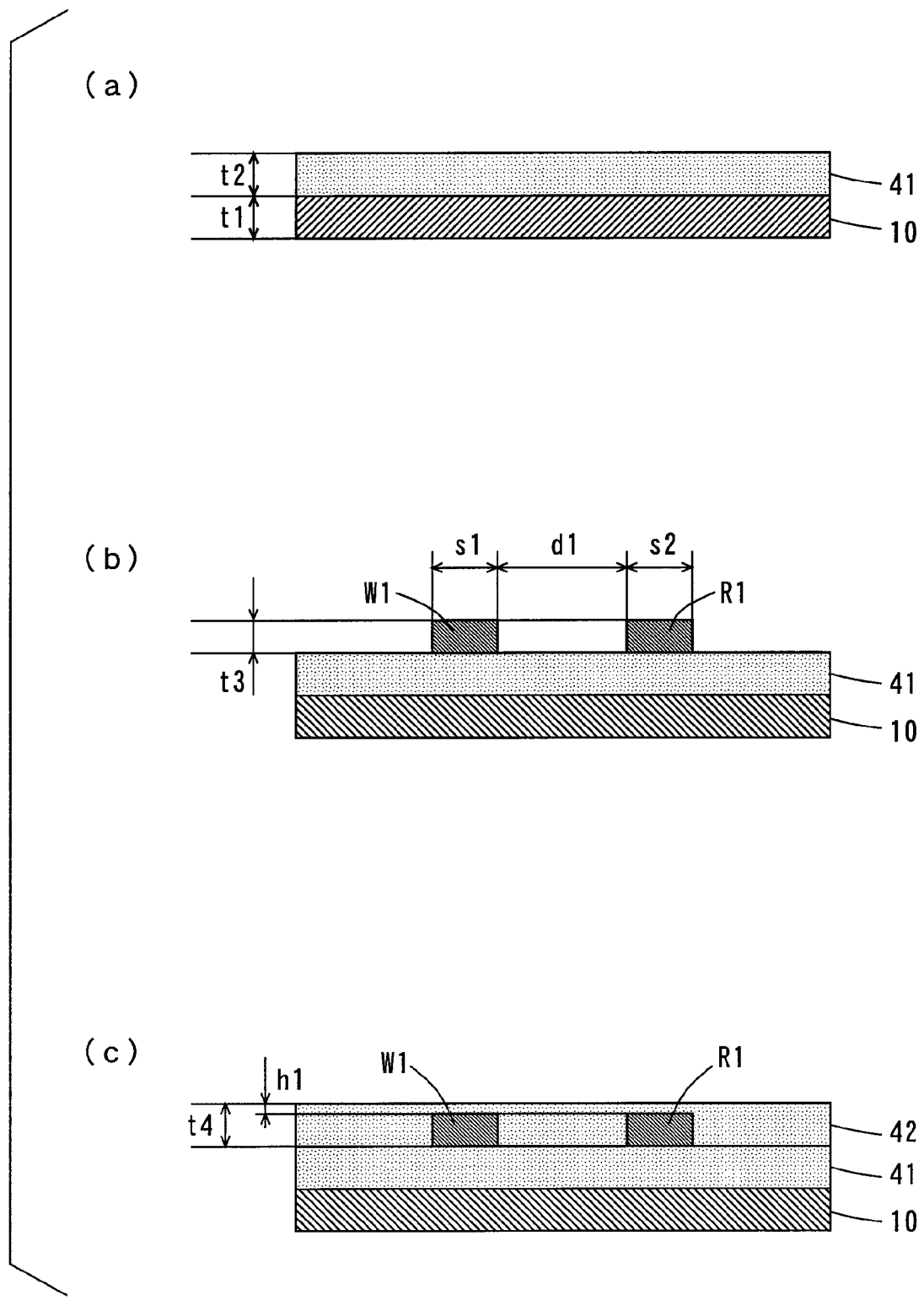
FIG. 3 is a diagram showing steps of manufacturing the suspension board according to the first embodiment.
Figure 4:
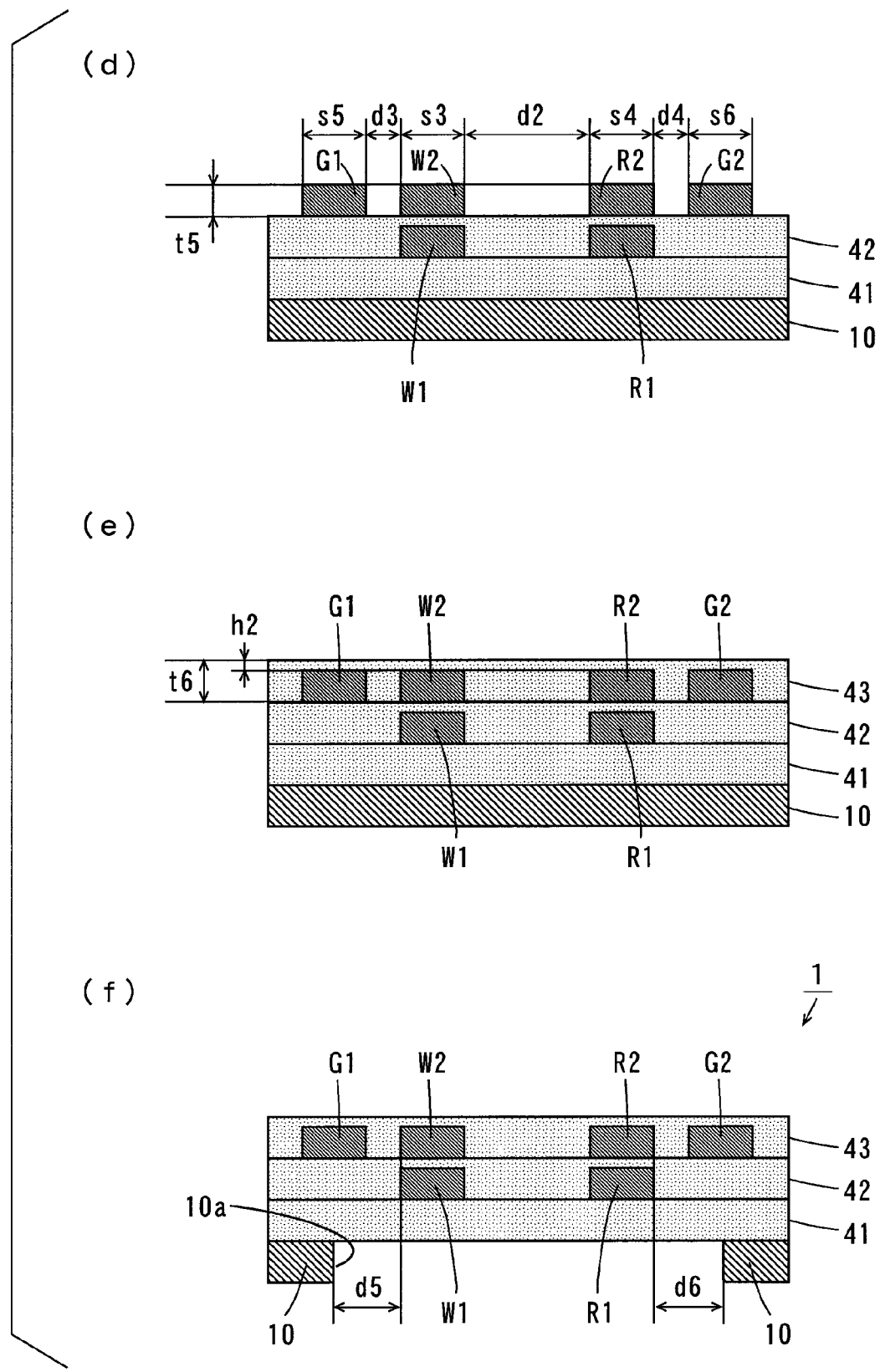
FIG. 4 is a diagram showing steps of manufacturing the suspension board according to the first embodiment.

FIGS. 3 and 4 are vertical sectional views showing steps of manufacturing the suspension board 1 according to the present embodiment. First, the long-sized substrate made of stainless steel (SUS) is prepared as the suspension body 10 as shown in FIG. 3 (a). Then, the first insulating layer 41 mainly made of polyimide resin is formed on the suspension body 10.

A long-sized substrate made of another metal material such as aluminum (Al) instead of stainless steel may be used as the suspension body 10. The thickness t1 of the suspension body 10 is not less than 5 μm and not more than 50 μm, for example, and preferably not less than 10 μm and not more than 30 μm. The thickness t2 of the first insulating layer 41 is not less than 3 μm and not more than 20 μm, for example, and preferably not less than 5 μm and not more than 15 μm.

Then, the write wiring trace W1 and the read wiring trace R1 made of copper (Cu) are formed on the first insulating layer 41 as shown in FIG. 3 (b). The write wiring trace W1 and the read wiring trace R1 are formed in parallel with each other at the predetermined distance.

The write wiring trace W1 and the read wiring trace R1 may be formed using a semi-additive method, for example, and may be formed using another method such as a subtractive method.

The write wiring trace W1 and the read wiring trace R1 can be formed using another metal such as gold (Au) and aluminum or an alloy such as a copper alloy and an aluminum alloy, not limited to copper.

The thickness t3 of the write wiring trace W1 and the read wiring trace R1 is not less than 3 μm and not more than 16 μm, for example, and preferably not less than 6 μm and not more than 13 μm. Each of the widths s1, s2 of the write wiring trace W1 and the read wiring trace R1 is not less than 5 μm and not more than 40 μm, for example, and preferably not less than 10 μm and not more than 30 μm.

The distance d1 between the write wiring trace W1 and the read wiring trace R1 is not less than 5 μm and not more than 100 μm, for example, and preferably not less than 10 μm and not more than 60 μm.

In the above-described configuration, thin metal films may be formed between the first insulating layer 41 and the write wiring trace W1 and between the first insulating layer 41 and the read wiring trace R1, respectively. In this case, adhesion between the first insulating layer 41 and the write wiring trace W1 and between the first insulating layer 41 and the read wiring trace R1 is improved.

After that, the second insulating layer 42 mainly made of polyimide resin is formed on the first insulating layer 41 so as to cover the write wiring trace W1 and the read wiring trace R1 as shown in FIG. 3 (c).

The thickness t4 of the second insulating layer 42 is not less than 4 μm and not more than 20 μm, for example, and preferably not less than 7 μm and not more than 17 μm. The thickness h1 between upper surfaces of the write wiring trace W1 and the read wiring trace R1 and an upper surface of the second insulating layer 42 is not less than 1 μm and not more than 5 μm, for example.

Next, the write wiring trace W2, the read wiring trace R2, the ground trace G1 and the ground trace G2 made of copper are formed on the second insulating layer 42 as shown in FIG. 4 (d). Here, the write wiring trace W2 and the read wiring trace R2 are formed at positions above the write wiring trace W1 and the read wiring trace R1, respectively.

This causes the upper surface of the write wiring trace W1 to be opposite to a lower surface of the write wiring trace W2, and causes the upper surface of the read wiring trace R1 to be opposite to a lower surface of the read wiring trace R2.

Note that the ground trace G1 is formed so as to align in parallel with the write wiring trace W2, and the ground trace G2 is formed so as to align in parallel with the read wiring trace R1.

The wiring traces W2, R2 and the ground traces G1, G2 are formed in the same manner as the wiring traces W1, R1. The wiring traces W2, R2 and the ground traces G1, G2 can be formed using another metal such as gold (Au) and aluminum or an alloy such as a copper alloy and an aluminum alloy, not limited to copper.

The thickness t5 of the wiring traces W2, R2 and the ground traces G1, G2 is not less than 3 μm and not more than 16 μm, for example, and preferably not less than 6 μm and not more than 13 μm. The widths s3, s4 of the write wiring trace W2 and the read wiring trace R2 are not less than 5 μm and not more than 40 μm, for example, and preferably not less than 10 μm and not more than 30 μm. The widths s5, s6 of the ground trace G1 and the ground trace G2 are not less than 5 μm and not more than 50 μm, for example, and preferably not less than 10 μm and not more than 40 μm. Note that the thickness of the wiring traces W2, R2 and the thickness of the ground traces G1, G2 may be equal or different from each other.

The distance d2 between the write wiring trace W2 and the read wiring trace R2 is not less than 5 μm and not more than 100 μm, for example, and preferably not less than 10 μm and not more than 60 μm.

The distance d3 between the write wiring trace W2 and the ground trace G1 and the distance d4 between the read wiring trace R2 and the ground trace G2 are not less than 10 μm and not more than 200 μm, for example, and preferably not less than 20 μm and not more than 100 μm.

Thin metal films may be formed between the second insulating layer 42 and the write wiring trace W2, between the second insulating layer 42 and the read wiring trace R2, between the second insulating layer 42 and the ground trace G1, and between the second insulating layer 42 and the ground trace G2, respectively. In this case, adhesion between the second insulating layer 42 and the wiring traces W2, R2 and between the second insulating layer 42 and the ground traces G1, G2 is improved.

Then, the third insulating layer 43 mainly made of polyimide resin is formed on the second insulating layer 42 so as to cover the wiring traces W2, R2 and the ground traces G1, G2 as shown in FIG. 4 (e).

The thickness t6 of the third insulating layer 43 is not less than 4 μm and not more than 20 μm, for example, and preferably not less than 7 μm and not more than 17 μm. The thickness h2 between upper surfaces of the write wiring trace W2 and the read wiring trace R2 and an upper surface of the third insulating layer 43 is not less than 1 μm and not more than 5 μm, for example.

Finally, a predetermined region of the suspension body 10 including the regions below the wiring traces W1, W2, R1, R2 is removed by etching as shown in FIG. 4 (f). Accordingly, the suspension board 1 is completed.

Note that in the width direction of the suspension board 1, each of the distance d5 between one side surface of the opening 10a and one side surface of the write wiring trace W1 and the distance d6 between the other side surface of the opening 10a and one side surface of the read wiring trace R1 is not less than 5 μm and not more than 150 μm, for example, and preferably not less than 10 μm and not more than 80 μm.

In the suspension board 1, the widths s1, s3 of the write wiring traces W1, W2 are equal to each other, and the widths s2, s4 of the read wiring traces R1, R2 are equal to each other.

The widths s1, s2 of the write wiring trace W1 and the read wiring trace R1 may be equal or different from each other. Also, the widths s3, s4 of the write wiring trace W2 and the read wiring trace R2 may be equal or different from each other.

Another resin material such as epoxy resin, acrylic resin, polyethernitrile resin, polyethersulfone resin, polyethylene terephthalate resin, polyethylene naphthalate resin and polyvinyl chloride resin may be used for the first to third insulating layers 41 to 43 instead of polyimide resin.

The first to third insulating layers 41 to 43 may be formed of different insulating materials or the same insulating material.

(1-3) Effects

In the suspension board 1 according to the present embodiment, the write wiring trace W1 is formed on the first insulating layer 41 and the write wiring trace W2 is formed on the second insulating layer 42. Moreover, the ground trace G1 is formed on the one side of the write wiring trace W2 on the second insulating layer 42.

In this case, the distance between the suspension body 10 and the write wiring trace W1 is smaller than the distance between the suspension body 10 and the write wiring trace W2, so that the capacitance of the write wiring trace W1 with respect to the suspension body 10 is larger than the capacitance of the write wiring trace W2 with respect to the suspension body 10.

Meanwhile, the distance between the ground trace G1 and the write wiring trace W1 is larger than the distance between the ground trace G1 and the write wiring trace W2, so that the capacitance of the write wiring trace W1 with respect to the ground trace G1 is smaller than the capacitance of the write wiring trace W2 with respect to the ground trace G1.

In this case, a difference of the capacitance caused between the write wiring trace W1 and the write wiring trace W2 with respect to the suspension body 10 can be canceled by the difference of the capacitance caused between the write wiring trace W1 and the write wiring trace W2 with respect to the ground trace G1. This allows the impedance of the write wiring trace W1 and the impedance of the write wiring trace W2 to be equivalent values at the time of transmitting differential signals through the write wiring traces W1, W2.

Similarly, the read wiring trace R1 is formed on the first insulating layer 41, and the read wiring trace R2 is formed on the second insulating layer 42. Moreover, the ground trace G2 is formed on one side of the read wiring trace R2 on the second insulating layer 42.

In this case, the difference of the capacitance caused between the read wiring trace R1 and the read wiring trace R2 with respect to the suspension body 10 can be canceled by the difference of the capacitance caused between the read wiring trace R1 and the read wiring trace R2 with respect to the ground trace G2 similarly to the case of the foregoing write wiring traces W1, W2. This allows the impedance of the read wiring trace R1 and the impedance of the read wiring trace R2 to be equivalent values at the time of transmitting differential signals through the read wiring traces R1, R2.

In addition, the opening 10a is formed in the region, below the region where the wiring traces W1, W2, R1, R2 are formed, of the suspension body 10 in the suspension board 1 according to the present embodiment.

In this case, the distance between the write wiring trace W1 and the suspension body 10 can be prevented from being much smaller than the distance between the write wiring trace W2 and the suspension body 10. This prevents the capacitance of the write wiring trace W1 with respect to the suspension body 10 from being much larger than the capacitance of the write wiring trace W2 with respect to the suspension body 10. As a result, the impedance of the write wiring trace W1 and the impedance of the write wiring trace W2 can easily be the equivalent values because of the foregoing effects of the ground trace G1.

Similarly, the distance between the read wiring trace R1 and the suspension body 10 can be prevented from being much smaller than the distance between the read wiring trace R2 and the suspension body 10. This prevents the capacitance of the read wiring trace R1 with respect to the suspension body 10 from being much larger than the capacitance of the read wiring trace R2 with respect to the suspension body 10. As a result, the impedance of the read wiring trace R1 and the impedance of the read wiring trace R2 can easily be the equivalent values because of the foregoing effects of the ground trace G2.

These results sufficiently prevent transmission errors of the differential signals caused by imbalance of the write wiring traces W1, W2 and imbalance of the read wiring traces R1, R2.

In the present embodiment, the write wiring trace W2 is arranged above the write wiring trace W1, and the read wiring trace R2 is arranged above the read wiring trace R1. Therefore, the distances between the write wiring traces W1, W2 and the read wiring trace R1 are substantially equal to the distances between the write wiring traces W1, W2 and the read wiring trace R2, respectively. Accordingly, it is considered that the magnitudes of induced electromotive forces generated in the read wiring traces R1, R2 are substantially equal when a write current flows through the write wiring traces W1, W2.

This prevents occurrence of a crosstalk between the write wiring traces W1, W2 and the read wiring traces R1, R2.

As a result, occurrence of errors at the time of transmitting the signals through the write wiring traces W1, W2 and errors at the time of transmitting the signals through the read wiring traces R1, R2 can be reliably prevented.

These results reliably prevent occurrence of the errors at the time of writing and reading information in/from a magnetic disk in the hard disk, which is not shown, including the suspension board 1.

Second Embodiment

Figure 5:
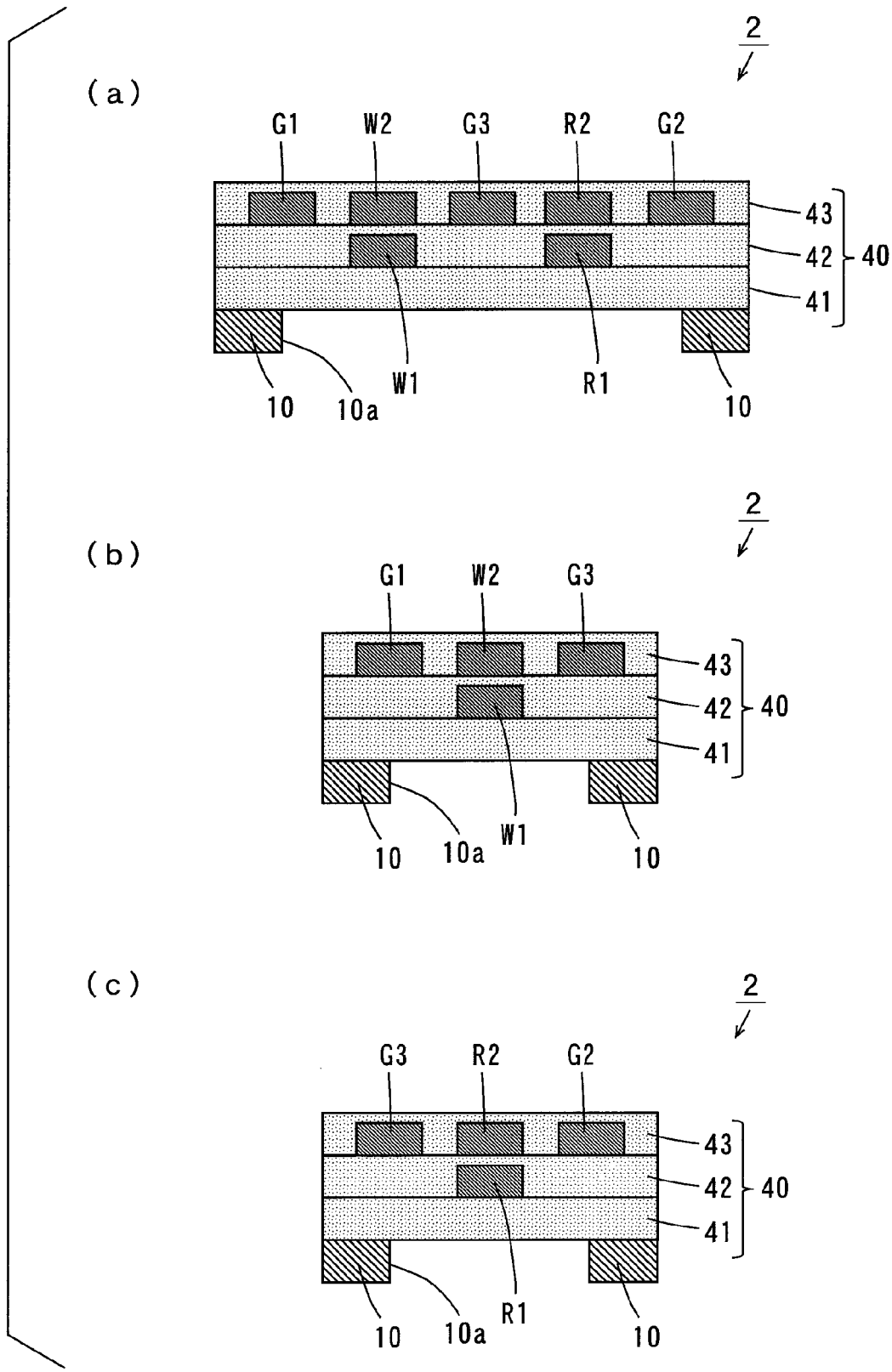
FIG. 5 is a sectional view showing a suspension board according to a second embodiment of the present invention.
Figure 6:
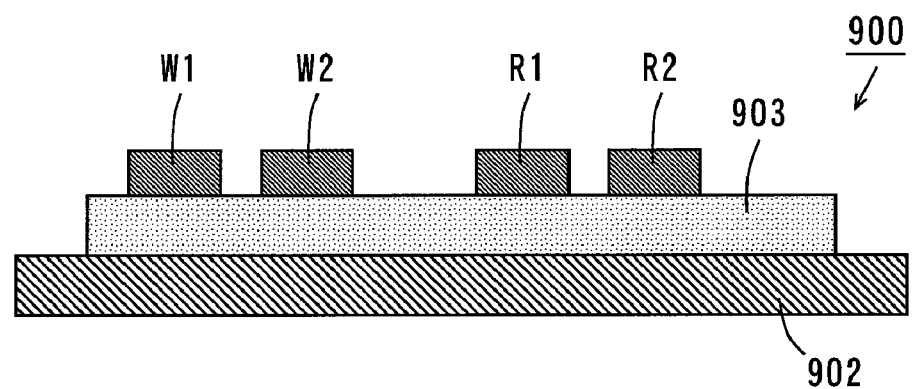
FIG. 6 is a vertical sectional view showing one example of a conventional suspension board.
Figure 7:
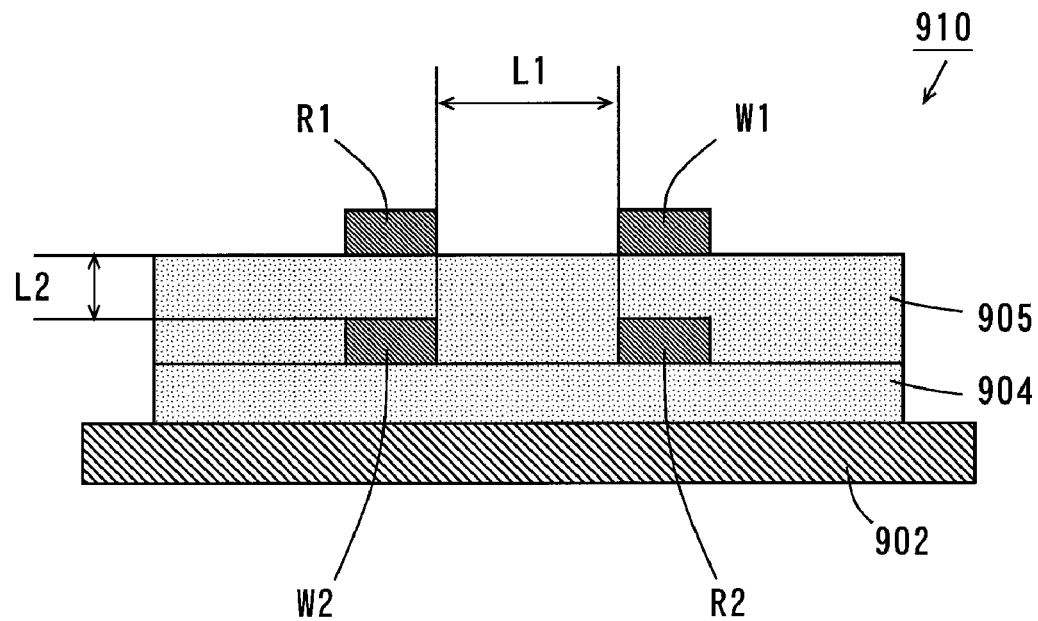
FIG. 7 is a vertical sectional view showing another example of the conventional suspension board.

FIG. 5 is a vertical sectional view showing a suspension board according to a second embodiment of the present invention. Note that in FIG. 5, (a) shows a sectional view taken along the arrowed line A-A of FIG. 1, (b) shows a sectional view taken along the arrowed line B-B, and (c) shows a sectional view taken along the arrowed line C-C.

The suspension board 2 according to the present embodiment is different from the suspension board 1 of FIG. 2 in the following points.

As shown in FIG. 5 (a), in the present embodiment, a ground trace G3 is formed between the write wiring trace W2 and the read wiring trace R2 on the third insulating layer 43 in the sectional view taken along the arrowed line A-A.

In this case, the ground trace G3 sufficiently prevents occurrence of the crosstalk between the write wiring traces W1, W2 and the read wiring traces R1, R2.

In addition, the ground trace G3 is formed on the other side of the write wiring trace W2 in the cross section taken along the arrowed line B-B as shown in FIG. 5 (b). In the cross section taken along the arrowed line C-C, the ground trace G3 is formed on the other side of the read wiring trace R2 as shown in FIG. 5 (c).

That is, the ground traces are formed on both sides of the write wiring trace W2, and the ground traces are formed on both sides of the read wiring trace R2 in the present embodiment. In this case, the impedance of the write wiring trace W1 and the impedance of the write wiring trace W2 can easily be the equivalent values. Moreover, the impedance of the read wiring trace R1 and the impedance of the read wiring trace R2 can easily be the equivalent values.

These results more reliably prevent occurrence of the errors at the time of writing and reading information in/from the magnetic disk in the hard disk, which is not shown, including the suspension board 1.

Note that only the ground trace G3 may be formed and the ground trace G1 and the ground trace G2 may not be formed.

<Correspondences Between Elements in the Claims and Parts in Embodiments>

In the following paragraph, non-limiting examples of correspondences between various elements recited in the claims below and those described above with respect to various preferred embodiments of the present invention are explained.

In the above-described embodiments, the suspension body 10 is an example of a conductive substrate, the write wiring trace W1 or the read wiring trace R1 is an example of a first or third wiring trace, the write wiring trace W2 or the read wiring trace R2 is an example of a second or fourth wiring trace, the ground trace G1, the ground trace G2 or the ground trace G3 is an example of a first, second or third ground trace, and the tongue 12 is an example of a head.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board comprising:
    a conductive substrate;
    a first insulating layer formed on said conductive substrate;
    a first wiring trace formed on said first insulating layer;
    a second insulating layer formed on said first insulating layer so as to cover said first wiring trace;
    a second wiring trace formed on said second insulating layer;
    a first ground trace formed on one side of the second wiring trace at a distance on said second insulating layer; and
    a third insulating layer formed on said second insulating layer so as to cover said second wiring trace and said first ground trace, wherein
    said first and second wiring traces constitute a first signal line pair, and
    an opening is formed in a region, below said first and second wiring traces, of said conductive substrate.

2. The printed circuit board according to claim 1, wherein said first wiring trace and said second wiring trace are arranged so as to be opposite to each other with said second insulating layer sandwiched therebetween.

3. The printed circuit board according to claim 1, wherein a width of said first wiring trace and a width of said second wiring trace are substantially equal.

4. The printed circuit board according to claim 1, further comprising a second ground trace formed on the other side of said second wiring trace at a distance on said second insulating layer.

5. The printed circuit board according to claim 1, further comprising
   a third wiring trace formed on said first insulating layer at a distance from said first wiring trace, and
   a fourth wiring trace formed on said second insulating layer at a distance from said second wiring trace, wherein
   said third and fourth wiring traces constitute a second signal line pair.

6. The printed circuit board according to claim 5, further comprising a third ground trace formed on one side of said fourth wiring trace on said second insulating layer.

7. The printed circuit board according to claim 5, further comprising a head that is provided in said conductive substrate and reads and writes signals, wherein
   said first, second, third and fourth wiring traces are electrically connected to said head.

\* \* \* \* \*